(12) United States Patent
Khaselev et al.

(10) Patent No.: US 12,246,376 B2
(45) Date of Patent: Mar. 11, 2025

(54) SINTER-READY SILVER FILMS

(71) Applicant: ALPHA ASSEMBLY SOLUTIONS INC., Waterbury, CT (US)

(72) Inventors: Oscar Khaselev, Waterbury, CT (US); Matthew James Siebenhuhner, Waterbury, CT (US); Monnir Boureghda, Waterbury, CT (US); Mike Marczi, Waterbury, CT (US); Carl Bilgrien, Waterbury, CT (US)

(73) Assignee: ALPHA ASSEMBLY SOLUTIONS INC., Waterbury, CT (US)

( * ) Notice: Subject to any disclaimer, the term of this patent is extended or adjusted under 35 U.S.C. 154(b) by 532 days.

(21) Appl. No.: 17/594,978

(22) PCT Filed: May 5, 2020

(86) PCT No.: PCT/EP2020/025205
§ 371 (c)(1),
(2) Date: Nov. 4, 2021

(87) PCT Pub. No.: WO2020/224806
PCT Pub. Date: Nov. 12, 2020

(65) Prior Publication Data
US 2022/0241852 A1    Aug. 4, 2022

Related U.S. Application Data

(60) Provisional application No. 62/844,235, filed on May 7, 2019.

(51) Int. Cl.
*B23K 1/00* (2006.01)
*B22C 9/22* (2006.01)
(Continued)

(52) U.S. Cl.
CPC ............ *B22D 21/06* (2013.01); *B22C 9/22* (2013.01); *B22D 25/04* (2013.01); *B23K 1/0016* (2013.01); *B23K 2101/40* (2018.08)

(58) Field of Classification Search
CPC ............ B23K 35/3006; B23K 35/0244; B23K 35/025; H01L 21/6835; H01L 2224/11505
See application file for complete search history.

(56) References Cited

U.S. PATENT DOCUMENTS 10,679,954 B2 *  6/2020  Love .................. H01L 24/03
11,370,066 B2 *  6/2022  Kawana .............. B22F 3/10
(Continued)

FOREIGN PATENT DOCUMENTS

CN    107845617 A    3/2018
DE    199 23 166 A1    12/2000
(Continued)

*Primary Examiner* — Erin B Saad
(74) *Attorney, Agent, or Firm* — Stinson LLP

(57) ABSTRACT

A method of making a combined sinter-ready silver film and carrier comprises the steps of: a) creating a carrier comprising designed openings; b) casting a silver film layer into the designed openings, for example casting a silver paste; and c) drying the carrier and silver film layer to form the combined sinter-ready silver film and carrier. The carrier may comprise a plastic carrier, which may be created by permanently bonding two plastic films, using a plasma bonding process or using a temperature stable glue. The carrier may comprise a stencil layer and a backing layer. The stencil layer may define the designed openings. The backing layer may be configured for sealing a bottom of the designed openings, wherein at the start of step b), a top of the designed openings may be open for receiving the cast silver film layer.

7 Claims, 6 Drawing Sheets

(51) Int. Cl.
  *B22D 21/00*   (2006.01)
  *B22D 21/06*   (2006.01)
  *B22D 25/04*   (2006.01)
  *B23K 101/40*   (2006.01)

(56) References Cited

U.S. PATENT DOCUMENTS

| | | | | |
|---|---|---|---|---|
| 11,462,502 | B2* | 10/2022 | Kawana | B22F 7/062 |
| 2002/0104449 | A1* | 8/2002 | Lee | H01L 21/6835 |
| | | | | 257/E21.508 |
| 2003/0222343 | A1* | 12/2003 | Sakaida | H01L 21/76898 |
| | | | | 257/737 |
| 2006/0011267 | A1* | 1/2006 | Kay | B23K 35/34 |
| | | | | 148/23 |
| 2006/0192182 | A1* | 8/2006 | Khaselev | B22F 1/102 |
| | | | | 252/500 |
| 2006/0194331 | A1* | 8/2006 | Pamula | B81B 3/0021 |
| | | | | 422/400 |
| 2012/0114927 | A1 | 5/2012 | Khaselev et al. | |
| 2017/0368643 | A1* | 12/2017 | Gu | B23K 35/262 |
| 2018/0144951 | A1* | 5/2018 | Koelling | B22F 1/17 |
| 2018/0358318 | A1* | 12/2018 | Shearer | B23K 35/26 |
| 2022/0241852 | A1* | 8/2022 | Khaselev | H01L 24/29 |

FOREIGN PATENT DOCUMENTS

| | | |
|---|---|---|
| DE | 10 2013 104572 A1 | 11/2014 |
| EP | 0 973 364 A2 | 1/2000 |
| WO | 2015/192004 A1 | 12/2015 |
| WO | 2016/182663 A1 | 11/2016 |

\* cited by examiner

SINTER-READY SILVER FILMS

The present specification is directed to methods of joining electrical or mechanical components, and more particularly to methods of attaching electronic components and associated devices onto circuit boards.

BACKGROUND TO THE DISCLOSURE

Sinter-ready silver films, which may be used for attaching dies, combine the physical properties of nano-silver powder and chemical formulations into products which allow the joining of various electronic devices to produce a thermal and electrical conductive interface.

US20120114927A1 states according to its abstract that methods for die attachment of multichip and single components may involve printing a sintering paste on a substrate or on the back side of a die. Printing may involve stencil printing, screen printing, or a dispensing process. Paste may be printed on the back side of an entire wafer prior to dicing, or on the back side of an individual die. Sintering films may also be fabricated and transferred to a wafer, die or substrate. A post-sintering step may increase throughput.

SUMMARY OF THE DISCLOSURE

In a first aspect the present disclosure provides a method of making a combined sinter-ready silver film and carrier, comprising the steps of:
  a) creating a carrier comprising designed openings;
  b) casting a silver film layer into the designed openings; and
  c) drying the carrier and silver film layer to form the combined sinter-ready silver film and carrier.

The method may further comprise the step of:
  d) rolling or cutting the combined sinter-ready silver film and carrier into individual sheets ready for industrial use.

In some embodiments the carrier may comprise a plastic carrier.

In some embodiments the carrier may be created by permanently bonding two plastic films. In some embodiments the two plastic films may be bonded using a plasma bonding process. In some other embodiments the two plastic films may be bonded using temperature stable glue.

The carrier may comprise a stencil layer and a backing layer.

In some embodiments the stencil layer may define the designed openings.

In some embodiments the stencil layer may have a thickness of 100-200 microns, optionally 150 microns. Additionally or alternatively the stencil layer may comprise a PET film.

In some embodiments the stencil layer may be die cut to produce the designed openings. In some embodiments the designed openings may be rectangular or square.

The backing layer may be configured for sealing a bottom of the designed openings.

In some embodiments the backing layer may have a thickness of 50 microns. Additionally or alternatively the backing layer may comprise a PET film.

In some embodiments the backing layer may be pretreated with oxygen plasma.

In some embodiments the stencil layer and the backing layer may be bonded using a laminator press, optionally under a pressure of 5 MPa and at a temperature of 150° C.

At the start of step b) a top of the designed openings may be open for receiving the cast silver film layer.

In some embodiments casting the silver film layer may comprise casting silver paste.

In some embodiments the silver film layer in step b) may comprise a solvent. After step c), the amount of solvent is reduced, and the solvent is preferably substantially absent in the combined sinter-ready silver film and carrier. Some remnants of the solvent may, however, remain.

In some embodiments the drying the carrier and silver film layer to form the combined sinter-ready silver film and carrier may be carried out in an oven, optionally at 130° C. for 20 minutes.

In a second aspect the present disclosure provides a combined sinter-ready silver film and carrier comprising a carrier comprising designed openings and a silver film layer cast into the designed openings.

In some embodiments the carrier may comprise a plastic carrier.

In some embodiments the carrier may comprise two permanently bonded plastic films.

The carrier may comprise a stencil layer and a backing layer.

In some embodiments the stencil layer may define the designed openings.

In some embodiments the stencil layer may have a thickness of 100-200 microns, optionally 150 microns. Additionally or alternatively the stencil layer may comprise a PET film.

In some embodiments the designed openings may be rectangular or square.

The backing layer may seal a bottom of the designed openings.

In some embodiments the backing layer may have a thickness of 50 microns. Additionally or alternatively the backing layer may comprise a PET film.

The silver film layer may be formed from casting silver paste. The silver film layer may comprise a solvent when cast.

In a third aspect the present disclosure provides a method of assembling a component to a substrate, comprising the steps of:
  a) positioning on top of the substrate a combined sinter-ready silver film and carrier of the type comprising a carrier comprising designed openings and a silver film layer cast into the designed openings, such that the silver film layer is face down;
  b) transferring the silver film layer onto the substrate by lamination;
  c) removing the carrier of the combined sinter-ready silver film and carrier;
  d) placing the component onto the substrate in contact with the transferred silver film layer to form an assembly; and
  e) sintering the assembly to create a silver joint between the component and the substrate.

In some embodiments in step b) the lamination may use a lamination press under pressure of 3-8 MPa, optionally 3-6 MPa, optionally 8 MPa, and temperature of 130-150° C., optionally 130° C.

In some embodiments in step e) the sintering may be at a pressure of 10 MPa and a temperature of 250° C.

In some embodiments the substrate may comprises a direct bonded copper (DBC), lead-frame, clip or clip array, wafer or any other part used in assembly of electronic devices and having a metallized surface.

In some embodiments the component may comprise a Si or SiC device and/or a die.

In some embodiments the combined sinter-ready silver film and carrier may be as defined in the second aspect described above.

In a fourth aspect the present disclosure provides an assembly of a component and a substrate joined together by a sintered silver joint, the assembly being obtainable by the method of the third aspect described above.

BRIEF DESCRIPTION OF THE DRAWINGS

One or more embodiments of the disclosure will now be described, by way of example only, with reference to the accompanying drawings in which.

DETAILED DESCRIPTION

Unless defined otherwise, all technical and scientific terms used in this specification have the same meaning as is commonly understood by the reader skilled in the art to which the claimed subject matter belongs. It is to be understood that the foregoing summary of the disclosure and the following examples are exemplary and explanatory only and are not restrictive of any subject matter claimed.

The following description is directed to embodiments of the disclosure. The description of the embodiments is not meant to include all the possible embodiments of the disclosure that are claimed in the appended claims. Many modifications, improvements and equivalents which are not explicitly recited in the following embodiments may fall within the scope of the appended claims. Features described as part of one embodiment may be combined with features of one or more other embodiments unless the context clearly requires otherwise.

In certain instances, a preferred method to use sinter-ready silver films is to laminate them on a substrate, such as direct bonded coppers (DBCs), lead-frames or clips. The present disclosure describes the extension of the existing sinter film technology to form a silver film uniquely patterned to provide selective lamination onto specific areas of the substrate. The process is suitable for high volume manufacturing of various power modules and discrete packages through the sintering process. The process utilizes capabilities of sinter able silver films and special patterning process to ensure accurate positioning and reliable connection of the components.

Figure 1A:
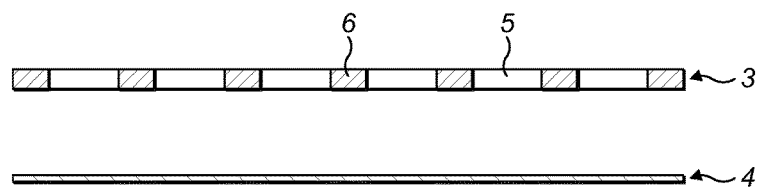
FIGS. 1a to 1c are schematic illustrations of a manufacturing process of a combined sinter-ready silver film and carrier according to the present disclosure.
Figure 1B:
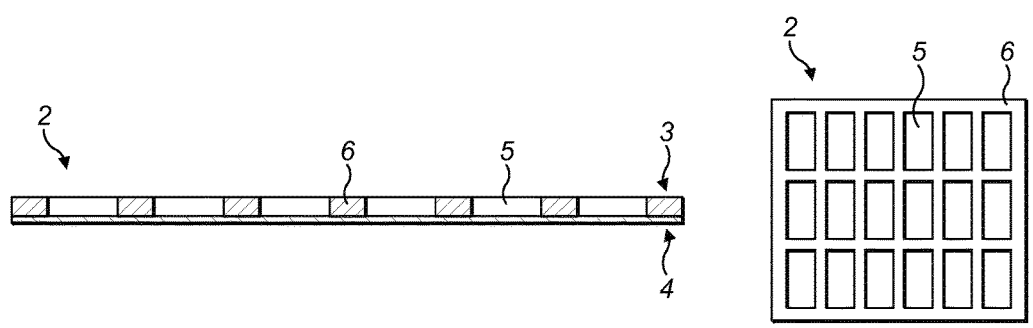
Figure 1C:
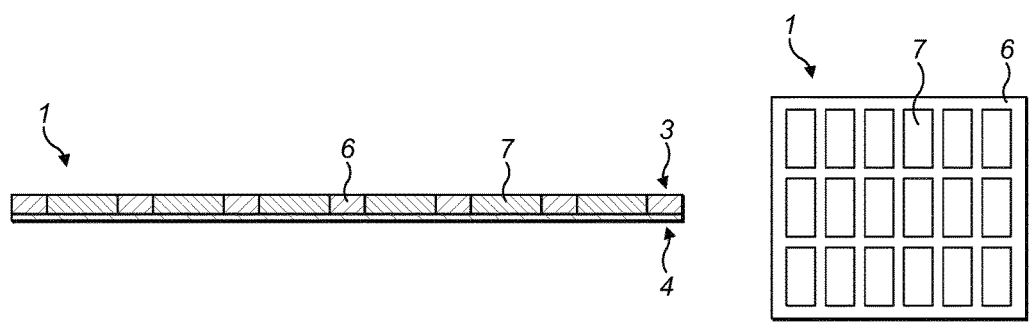

FIG. 1a to 1c show schematic illustrations of the patterning process. First, a carrier 2 is created by bonding permanently two plastic films 3, 4. In some embodiments the carrier 2 can be comprised of two layers of polyethylene terephthalate (PET) film bonded together.

The two plastic films may comprise a stencil layer 3 and a backing layer 4 as shown in FIG. 1a. The stencil layer 3 may be referred to as 'Layer 1' and the backing layer 4 may be referred to as 'Layer 2'.

The top plastic film, i.e. the stencil layer 3, is pre-cut through to form openings/holes 5 according to a desired pattern design. The openings/holes 5 may also be referred to as designed openings 5. A body of the stencil layer 3 is referenced in FIG. 1a with the numeral 6. The holes 5 may be stamped through the stencil layer 3. The openings/holes 5 may be square, rectangular or of other shape. The stencil layer 3 may for formed of PET and may have a thickness of 100-200 microns. In one non-limiting embodiment the stencil layer 3 of the carrier 2 is comprised of 150 micron thick PET film that was die cut to produce square openings/holes 5 of 13×13 mm².

The bottom plastic film, i.e. the backing layer 4 may for formed of PET and may have a thickness of 50 microns. The backing layer 4 may be formed from PET film on a roll.

Figure 3A:
FIG. 3a is a photograph of a carrier, formed of PET film, with square openings.

The stencil layer 3 and the backing layer 4 are bonded together using a conventional plasma bonding process or using temperature stable glue to form the carrier 2 as shown in FIG. 1b. A non-limiting example of the carrier 2 is shown in FIG. 3a.

In some embodiments an oxygen plasma pre-treatment may be carried out on the backing layer 4 or both the stencil layer 3 and the backing layer 4. In one non-limiting embodiment the oxygen plasma pre-treatment is with oxygen plasma for 10 minutes.

In some embodiments the stencil layer 3 and the backing layer 4 may be bonded together under pressure and temperature. In one non-limiting embodiment the bonding is carried out using a laminator press under a pressure of 5 MPa and at a temperature of 150° C.

Once the carrier 2 is formed the special silver paste is casted into the openings/holes 5 of the carrier 2. The silver paste may comprise a solvent. In one non-limiting embodiment the silver paste may be Argomax® paste available from MacDermid Alpha-Assembly Solutions of Somerset, NJ, USA.

The carrier 2 with the silver paste is dried in an oven to form patterns of sinter-ready silver film 7 as shown in FIG. 1c. In one non-limiting embodiment the carrier 2 and the silver paste were dried at 130° C. for 20 minutes. The drying step may drive off at least some of the solvent from the silver paste. After the drying step is completed the amount of solvent is reduced, and the solvent is preferably substantially absent from the sinter-ready silver film 7. Some remnants of the solvent may, however, remain.

Figure 3B:
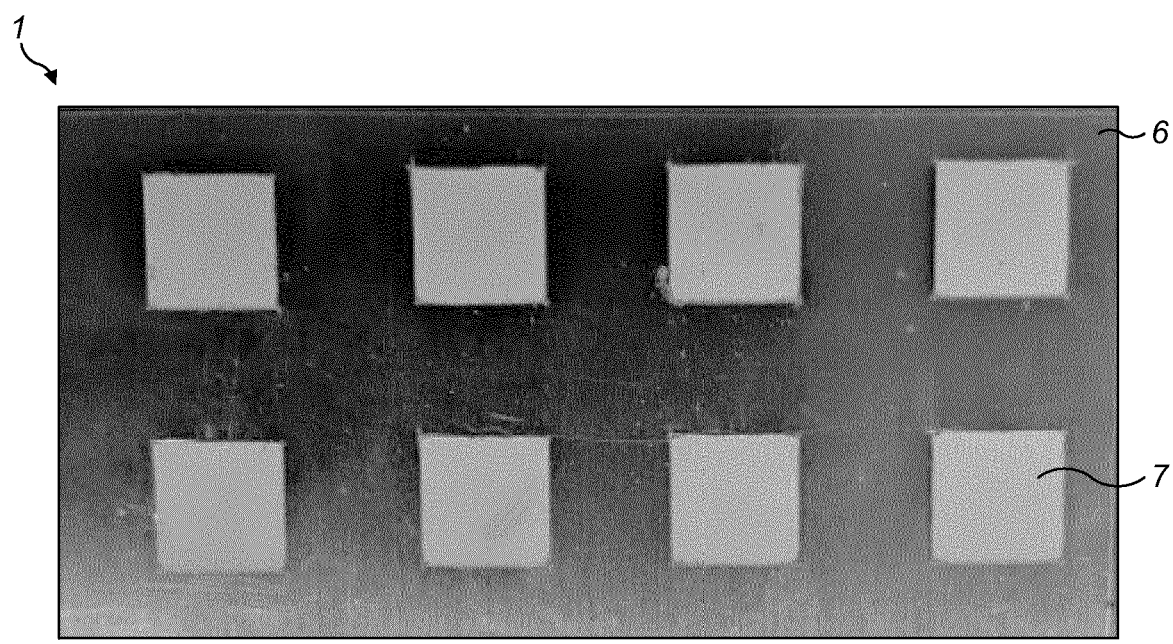
FIG. 3b is a photograph of the carrier of FIG. 3a after casting of a silver film layer into the openings.

The carrier 2 and the sinter-ready silver film 7 together are referred to in the present disclosure as a combined sinter-ready silver film and carrier 1. The combined sinter-ready silver film and carrier 1 can be rolled or cut into individual sheets to be ready for industrial use. A non-limiting example of the combined sinter-ready silver film and carrier 1 is shown in FIG. 3b.

Figure 3C:
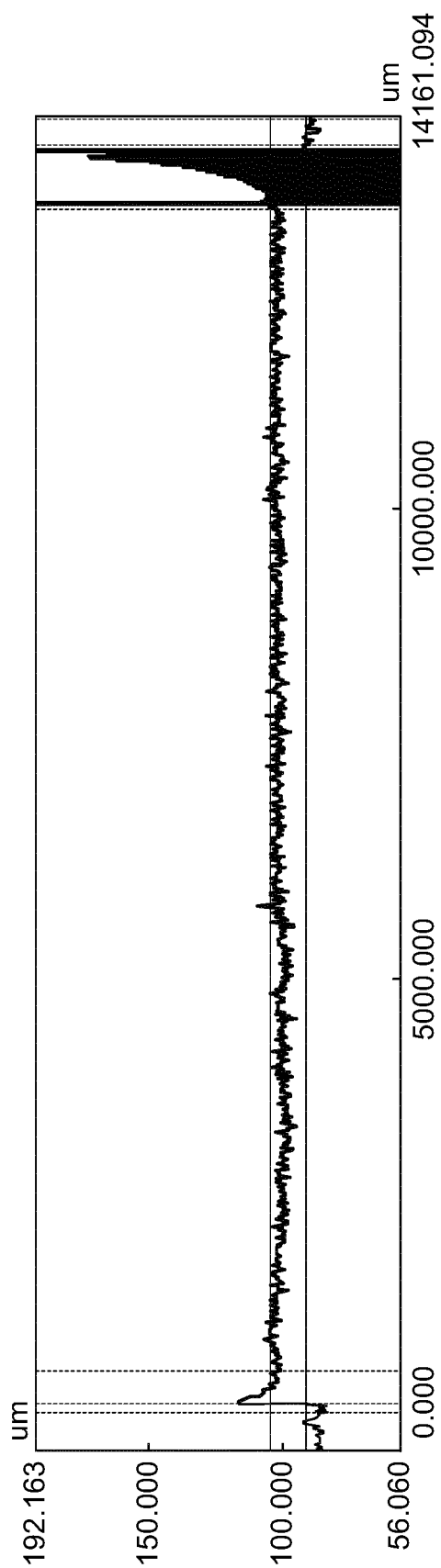
FIG. 3c shows a flatness profile of the silver film layer.

In one non-limiting embodiment the silver film thickness of the sinter-ready silver film 7 was about 100 microns and uniform across the entire pattern, as shown in the flatness profile of FIG. 3c.

To use the combined sinter-ready silver film and carrier 1 in an application, the patterned sinter-ready silver film 7 is laminated to a substrate 10. The substrate 10 can be a DBC, lead-frame, clip or clip array, wafer or any other part used in assembly of electronic devices and having a metallized surface. Once the sinter-ready silver film 7 is laminated to the substrate 10, the part is ready for assembly using a sintering process.

Figure 2A:
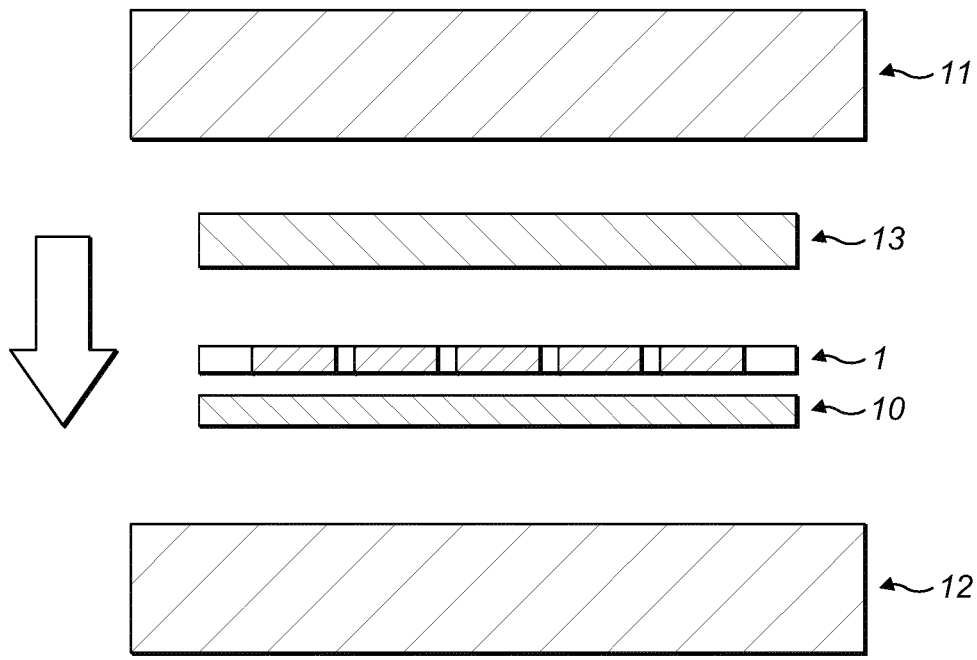
FIGS. 2a and 2b are schematic illustrations of a lamination process.
Figure 2B:
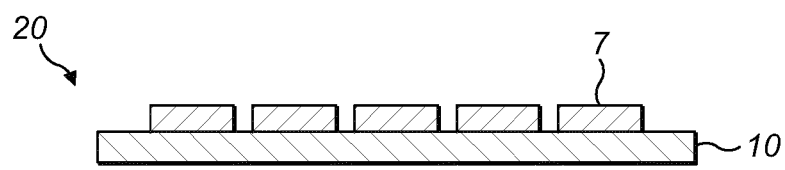

An example lamination process is shown schematically in FIGS. 2a and 2b. The lamination may be carried out using a lamination press, shown schematically in FIG. 2a. The lamination press may comprise a top platen 11 and a bottom platen 12 that are used to apply compressive pressure to the combined sinter-ready silver film and carrier 1 and the substrate 10. The top platen 11 and the bottom platen 12 may be heated to 130° C.

Figure 4A:
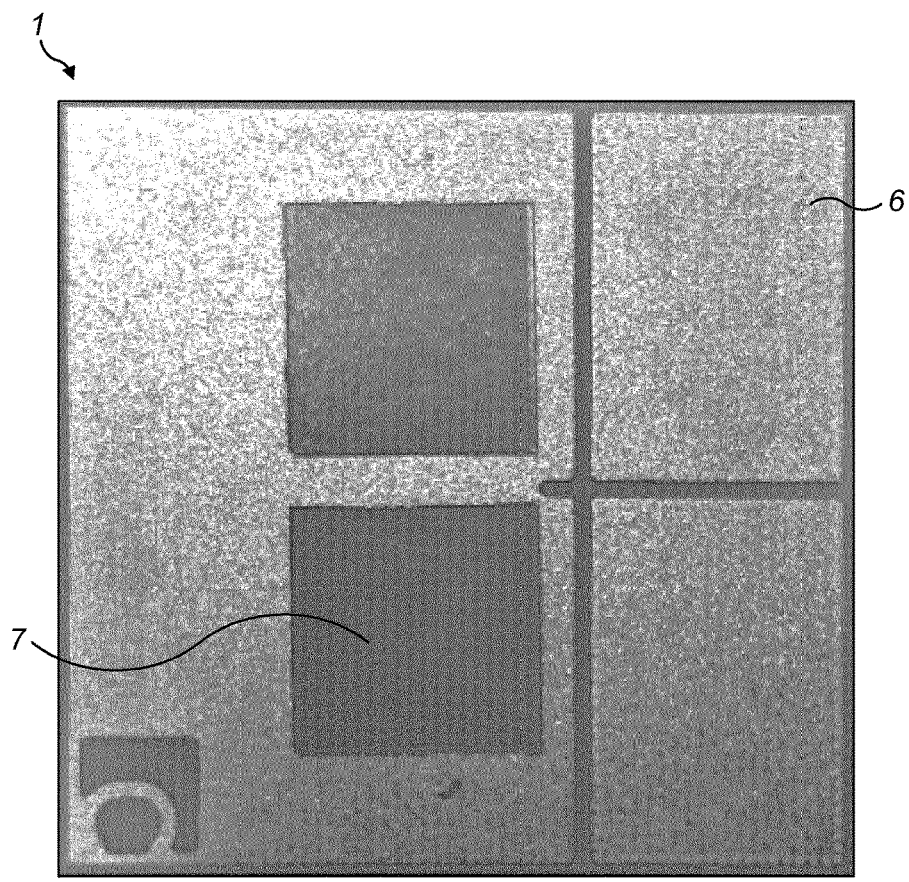
FIGS. 4a and 4b show a direct bonded copper (DBC) substrate laminated with a patterned silver film according to the present disclosure.
Figure 4B:
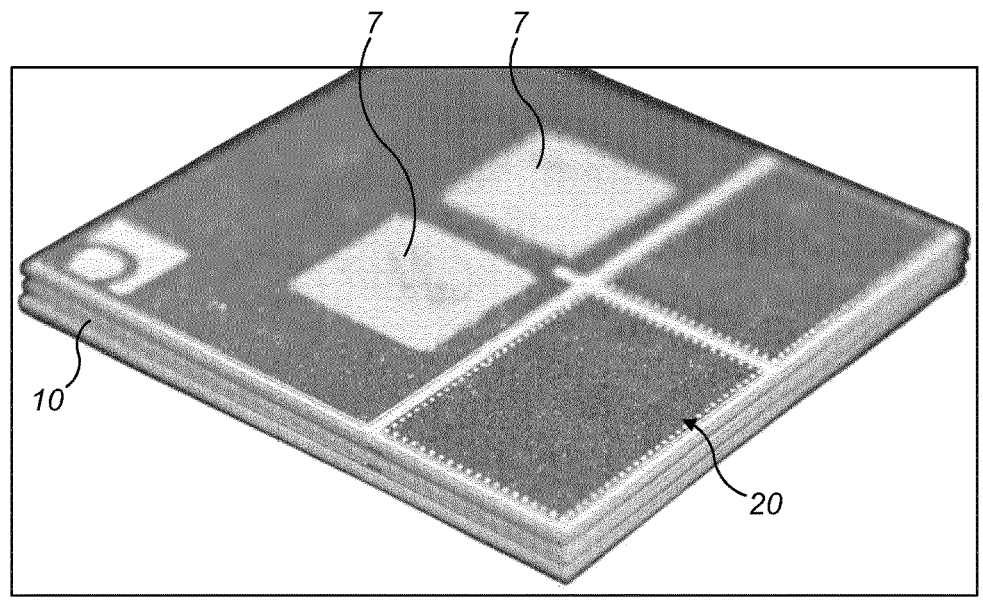

A graphite sheet 13 may be interposed between the upper platen 11 and the combined sinter-ready silver film and carrier 1. The combined sinter-ready silver film and carrier 1 is positioned on top of the substrate 10 (for example a DBC) with the sinter-ready silver film 7 face down. The sinter-ready silver film 7 is transferred from the carrier 2 onto the substrate 10 in the lamination press under pressure of 5 MPa, alternatively of 8 MPa, and at a temperature of 130° C., as shown schematically in FIG. 2b. A non-limiting example of a resulting substrate 10 (in this example a DBC) laminated with sinter-ready silver film 7 is shown in FIGS. 4a and 4b.

Figure 5:
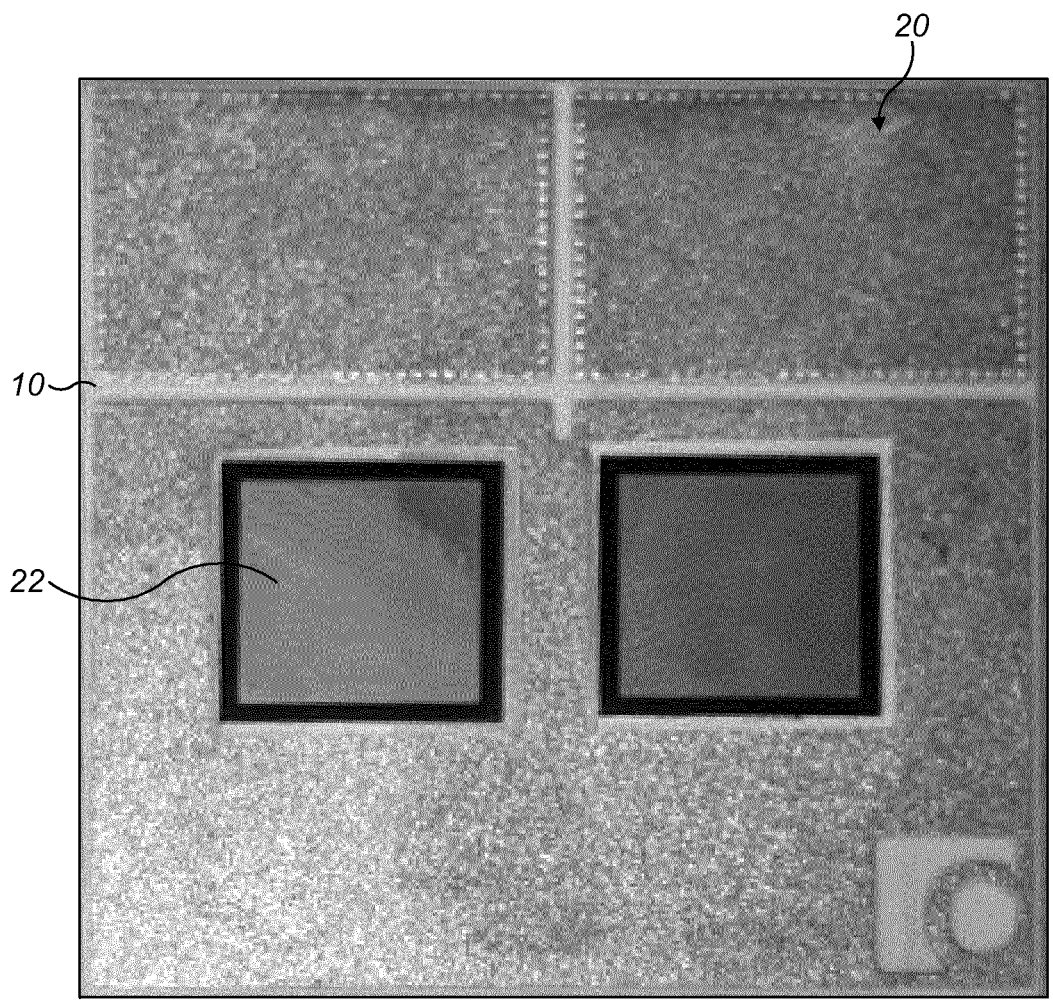
FIG. 5 is a photograph showing dies placed on the silver film of FIGS. 4a and 4b and sintered to the DBC substrate.

A component may then be joined to the substrate 10 by sintering of the sinter-ready silver film to form a silver joint. A non-limiting example in shown in FIG. 5 in which dies 22 were mounted on the laminated sinter-ready silver film 7 and sintered to the substrate 10 in a sintering press at 10 MPa and 250° C.

INDUSTRIAL APPLICABILITY

The patterned combined sinter-ready silver film and carrier 1 may be comprised of a plastic carrier 2 with designed openings 5 and a sinter-ready silver film layer 7 casted into the openings 5. The layout of the pattern of the sinter-ready silver film 7 is advantageously defined by the design of the electronic device to be assembled. The patterned sinter-ready silver films 7 are used in production in a two-step process. In a first step, the sinter-ready silver film 7 is transferred from the carrier 2 onto the substrate 10 by lamination at a typical pressure of 3-6 MPa and at a temperature of 130-150° C. The typical substrates used are ceramic DBC, lead-frames, clips and wafers with Si or SiC devices. In a second step, components are placed onto the substrate 10 and the assembly is sintered at a typical pressure of 10 MPa and at temperature of 250° C. to create a highly reliable silver joint. Advantageously the process is well suited for high volume manufacturing of power modules, discrete components and various other devices.

The combined sinter-ready silver film and carrier 1 of the present disclosure may advantageously be positioned to fit into existing manufacturing equipment and processes to enable high volume manufacturing. In one example, sinter-ready silver films 7 may be laminated to an individual die or a wafer followed by dicing. The laminated die can then be placed on a substrate and sintered under applied heat and pressure. The resulting joint between the die and the substrate is metallic silver with the structure and properties shown below:

Typical Argomax® Joint
    Composition: sintered silver particles
    Density: 85-95%
    Thermal conductivity: ~200 WmK
    Electrical conductivity: ~3 µΩ/cm
    Young's Modulus: ~20 GPa The combined sinter-ready silver film and carrier 1 of the present disclosure may be used for attachment of components in a wide variety of devices and applications from large area thyristors and power modules for electrical and automotive equipment to miniature discrete components for mobile technology and LED lighting. The technology may improve performance of existing devices by either increasing power or light output or reliability by over 5 to 30 times compared to traditional joining techniques. The films enable use of the new high temperature SiC and GaN semiconductors and new device designs that produce electrical efficiency unattainable with existing technologies.

Further aspects of the present disclosure are set out in the following clauses.

Clauses

Clause 1. A method of making a combined sinter-ready silver film and carrier, comprising the steps of:
    a) creating a carrier comprising designed openings;
    b) casting a silver film layer into the designed openings; and
    c) drying the carrier and silver film layer to form the combined sinter-ready silver film and carrier.

Clause 2. The method of clause 1, further comprising the step of:
    d) rolling or cutting the combined sinter-ready silver film and carrier into individual sheets ready for industrial use.

Clause 3. The method of clause 1 or clause 2, wherein the carrier comprises a plastic carrier.

Clause 4. The method of any preceding clause, wherein the carrier is created by permanently bonding two plastic films.

Clause 5. The method of clause 4, wherein the two plastic films are bonded using a plasma bonding process.

Clause 6. The method of clause 4, wherein the two plastic films are bonded using temperature stable glue.

Clause 7. The method of any preceding clause, wherein the carrier comprises a stencil layer and a backing layer.

Clause 8. The method of clause 7, wherein the stencil layer defines the designed openings.

Clause 9. The method of clause 7 or clause 8, wherein the stencil layer has a thickness of 100-200 microns. optionally 150 microns.

Clause 10. The method of any one or clauses 7 to 9, wherein the stencil layer comprises a PET film.

Clause 11. The method of any one or clauses 7 to 10, wherein the stencil layer is die cut to produce the designed openings.

Clause 12. The method of any one or clauses 7 to 11, wherein the designed openings are rectangular or square.

Clause 13. The method of any one or clauses 7 to 12, wherein the backing layer is configured for sealing a bottom of the designed openings.

Clause 14. The method of any one or clauses 7 to 13, wherein the backing layer has a thickness of 50 microns.

Clause 15. The method of any one or clauses 7 to 14, wherein the backing layer comprises a PET film.

Clause 16. The method of any one or clauses 7 to 15, wherein the backing layer is pretreated with oxygen plasma.

Clause 17. The method of any one or clauses 7 to 16, wherein the stencil layer and the backing layer are bonded using a laminator press, optionally under a pressure of 5 MPa and at a temperature of 150° C.

Clause 18. The method of any one or clauses 7 to 17, wherein at the start of step b) a top of the designed openings is open for receiving the cast silver film layer.

Clause 19. The method of any preceding clause, wherein casting the silver film layer comprises casting silver paste.

Clause 20. The method of any preceding clause, wherein the silver film layer comprises a solvent.

Clause 21. The method of any preceding clause, wherein the drying the carrier and silver film layer to form the combined sinter-ready silver film and carrier is carried out in an oven, optionally at 130° C. for 20 minutes.

Clause 22. A combined sinter-ready silver film and carrier comprising a carrier comprising designed openings and a silver film layer cast into the designed openings.

Clause 23. The combined sinter-ready silver film and carrier of clause 22, wherein the carrier comprises a plastic carrier.

Clause 24. The combined sinter-ready silver film and carrier of clause 22 or clause 23, wherein the carrier comprises two permanently bonded plastic films.

Clause 25. The combined sinter-ready silver film and carrier of any one of clauses 22 to 24, wherein the carrier comprises a stencil layer and a backing layer.

Clause 26. The combined sinter-ready silver film and carrier of clause 25, wherein the stencil layer defines the designed openings.

Clause 27. The combined sinter-ready silver film and carrier of clause 25 or clause 26, wherein the stencil layer has a thickness of 100-200 microns, optionally 150 microns.

Clause 28. The combined sinter-ready silver film and carrier of any one of clauses 25 to 27, wherein the stencil layer comprises a PET film.

Clause 29. The combined sinter-ready silver film and carrier of any one of clauses 25 to 28, wherein the designed openings are rectangular or square.

Clause 30. The combined sinter-ready silver film and carrier of any one of clauses 25 to 29, wherein the backing layer seals a bottom of the designed openings.

Clause 31. The combined sinter-ready silver film and carrier of any one of clauses 25 to 30, wherein the backing layer has a thickness of 50 microns.

Clause 32. The combined sinter-ready silver film and carrier of any one of clauses 25 to 31, wherein the backing layer comprises a PET film.

Clause 33. The combined sinter-ready silver film and carrier of any one of clauses 22 to 32, wherein the silver film layer is formed from casting silver paste.

Clause 34. The combined sinter-ready silver film and carrier of any one of clauses 22 to 33, wherein the silver film layer comprises a solvent when cast.

Clause 35. A method of assembling a component to a substrate, comprising the steps of:
a) positioning on top of the substrate a combined sinter-ready silver film and carrier of the type comprising a carrier comprising designed openings and a silver film layer cast into the designed openings, such that the silver film layer is face down;
b) transferring the silver film layer onto the substrate by lamination;
c) removing the carrier of the combined sinter-ready silver film and carrier;
d) placing the component onto the substrate in contact with the transferred silver film layer to form an assembly; and
e) sintering the assembly to create a silver joint between the component and the substrate.

Clause 36. The method of clause 35, wherein in step b) the lamination uses a lamination press under pressure of 3-8 MPa, optionally 3-6 MPa, optionally 8 MPa, and temperature of 130-150° C., optionally 130° C.

Clause 37. The method of clause 35 or clause 36, wherein in step e) the sintering is at a pressure of 10 MPa and a temperature of 250° C.

Clause 38. The method of any one of clauses 35 to 37, wherein the substrate comprises a direct bonded copper (DBC), lead-frame, clip or clip array, wafer or any other part used in assembly of electronic devices and having a metallized surface.

Clause 39. The method of any one of clauses 35 to 38, wherein the component comprises a Si or SiC device and/or a die.

Clause 40. The method of any one of clauses 35 to 39, wherein the combined sinter-ready silver film and carrier is as defined in any one of clauses 22 to 34.

Clause 41. An assembly of a component and a substrate joined together by a sintered silver joint, the assembly being obtainable by the method of any one of clauses 35 to 40.

It is to be understood that at least some of the figures and descriptions of the disclosure have been simplified to focus on elements that are relevant for a clear understanding of the disclosure, while eliminating, for purposes of clarity, other elements that the reader skilled in the art will appreciate may also be required. Because such elements are well known to the reader skilled in the art, and because they do not necessarily facilitate a better understanding of the disclosure, a description of such elements is not provided herein.

The invention claimed is:

1. A method of making a combined sinter-ready silver film and carrier, comprising the steps of:
a) creating a carrier comprising designed openings;
b) casting a silver film layer into the designed openings;
c) drying the carrier and silver film layer to form the combined sinter-ready silver film and carrier; and
d) rolling or cutting the combined sinter-ready silver film and carrier into individual sheets ready for industrial use.

2. The method of claim 1, wherein the carrier is created by permanently bonding two plastic films.

3. The method of claim 1, wherein the carrier comprises a stencil layer and a backing layer.

4. The method of claim 3, wherein the stencil layer defines the designed openings.

5. The method of claim 3, wherein the backing layer is configured for sealing a bottom of the designed openings.

6. The method of claim 3, wherein at the start of step b) a top of the designed openings is open for receiving the cast silver film layer.

7. The method of claim 3, wherein casting the silver film layer comprises casting silver paste.

* * * * *